United States Patent
Delfino et al.

(10) Patent No.: US 12,322,060 B2
(45) Date of Patent: Jun. 3, 2025

(54) METHOD FOR DUPLICATING A GRAPHICAL USER INTERFACE (GUI) ELEMENT IN A 3D SCENE

(71) Applicant: DASSAULT SYSTEMES, Velizy Villacoublay (FR)

(72) Inventors: Christophe Delfino, Biot (FR); Marine Zulian, Biot (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 225 days.

(21) Appl. No.: 18/085,216

(22) Filed: Dec. 20, 2022

(65) Prior Publication Data

US 2023/0196704 A1    Jun. 22, 2023

(30) Foreign Application Priority Data

Dec. 20, 2021   (EP) .................................. 21306850

(51) Int. Cl.
*G06T 19/20*     (2011.01)
*G02B 27/01*     (2006.01)
(Continued)

(52) U.S. Cl.
CPC .......... *G06T 19/20* (2013.01); *G02B 27/0172* (2013.01); *G06F 3/017* (2013.01);
(Continued)

(58) Field of Classification Search
CPC ............. G06T 19/20; G06T 2219/2004; G06T 2219/2012; G06T 2219/2024;
(Continued)

(56) References Cited

U.S. PATENT DOCUMENTS 9,152,321 B2 * 10/2015 Hicks .................. G06F 3/04886
10,656,752 B1 * 5/2020 Smith .................... G06F 1/1647
(Continued)

FOREIGN PATENT DOCUMENTS

EP    2 333 651 A1    6/2011

OTHER PUBLICATIONS

European Office Action issued Jun. 1, 2022 in European Application No. 21306850.5, citing document 15, 9 pgs.

*Primary Examiner* — Kee M Tung
*Assistant Examiner* — Biao Chen
(74) *Attorney, Agent, or Firm* — Oblon, McClelland, Maier & Neustadt, L.L.P.

(57) ABSTRACT

A computer-implemented method for duplicating a GUI element in a 3D scene including obtaining a 3D model and a GUI element in the 3D scene, the GUI element including an anchor attached to the 3D model and including a body being window containing text and/or graphical elements, receiving a first user interaction indicative of a hold gesture on the anchor, by a user using a first appendage, while maintaining the hold gesture of the first appendage on the anchor, receiving a second user interaction indicative a hold gesture on the body, by the user using a second appendage, while maintaining the hold gesture using the first and second appendage, moving the second appendage outside the body, thereby duplicating the GUI element into a second GUI element, including an anchor, the position of the anchor of the second GUI element being defined by the position of second appendage.

16 Claims, 15 Drawing Sheets

(51) Int. Cl.
  *G06F 3/01*      (2006.01)
  *G06F 3/04815*   (2022.01)
  *G06F 3/04883*   (2022.01)

(52) U.S. Cl.
  CPC ...... *G06F 3/04815* (2013.01); *G06F 3/04883* (2013.01); *G06T 2219/2004* (2013.01); *G06T 2219/2012* (2013.01); *G06T 2219/2024* (2013.01)

(58) Field of Classification Search
  CPC . G02B 27/0172; G06F 3/017; G06F 3/04815; G06F 3/04883
  See application file for complete search history.

(56) References Cited

U.S. PATENT DOCUMENTS

| | | | |
|---|---|---|---|
| 10,775,981 B2* | 9/2020 | Peythieux | G06F 3/0488 |
| 2011/0141043 A1* | 6/2011 | Soubrie | G06F 3/04883 |
| | | | 345/173 |
| 2020/0205905 A1* | 7/2020 | Merdan | G16H 80/00 |

\* cited by examiner

METHOD FOR DUPLICATING A GRAPHICAL USER INTERFACE (GUI) ELEMENT IN A 3D SCENE

FIELD

The disclosure relates to the field of computer programs and systems, and more specifically to a computer-implemented method for duplicating a markup in a three-dimensional scene. It pertains to the fields of computer graphics, Authoring, Computer Aided Design (CAD), Computer Aided Engineering (CAE) and Computer Aided Manufacturing (CAM), and applies to all the situations wherein a digitally-modeled object has to be annotated in a three-dimensional scene.

BACKGROUND

CAD applications, such as the one provided by Dassault Systèmes under the trademark Catia, allow a user to construct and manipulate complex three dimensional or 3D models of objects or assemblies of objects.

In this description, the expression "3D model" includes any virtual object that can be displayed to a user, including without limitation tri-dimensional objects, two-dimensional objects, drawings, digital images and the like.

Touch screens are commonly used in many electronic devices and systems to display text and/or modeled objects. They are also known as touch-screens, touchscreens or touch sensitive displays. The user is able to interact with a touch screen through a user interface comprising user interface objects. A touch screen device detects and responds to contact on the touch screen.

In a collaborative design process, which implicates several designers, or different teams such as design and marketing teams, it may be useful to annotate the designed 3D model, so as to display relevant information to the other collaborators.

In what follows, a markup refers to an annotation which is associated to a 3D model, or to a part of the 3D model.

A markup is a graphical user interface element (GUI) which is composed of an anchor ANC and a body BOD, as illustrated by FIG. 1. The anchor ANC is a 3D point which is attached to the 3D model MOD. The body BOD is a 2D surface which comprises design features which are associated to the 3D model MOD where the anchor ANC is located. The style of the body BOD, i.e. the esthetical appearance of the body, can be set by the user, or it can have a default setting.

The anchor ANC and the body BOD may be connected by a line LIN, so that the user may visualize to which element the body BOD is pointing at, although the presence of a line is not always required, in particular when it is sufficiently clear to which 3D model the body BOD corresponds.

The duplication of a markup, i.e. the copy/paste operation, may save time, especially when a plurality of 3D objects, or a plurality of parts of a 3D object, are to be annotated.

However, the creation of a markup from scratch, for each 3D object, may be cumbersome.

Indeed, in the existing solutions, illustrated by FIG. 1, in order to duplicate a markup with an existing style in touch mode, the user makes firstly a long hold on the body BOD, with an appendage (finger or stylus), which makes a panel PAN appear. The panel PAN may comprise several buttons corresponding to functions such as "copy", "paste", "delete", "hide", or a color palette for applying a color to the body BOD.

The user taps on the "copy" button. Then, the user taps on another 3D model, which makes the panel PAN appear again. The user taps on the "paste" button. Then, the user applies the style of the initial markup to the duplicated markup, and binds the markup with the 3D model.

For another duplication of the markup, the user has to make the same gestures, and place at the right position every newly created instance. Duplicating many markups may be very tedious.

Alternatively, the user may create many markups at once, by using the "paste" command multiple times, and then apply a similar style to all the markups.

Those methods induce many taps and hand motions.

Therefore, there is a need for simplifying the workflow by reducing the amount of time spent and gestures used in the duplication of markups.

SUMMARY

An object of the present disclosure is a computer-implemented method for duplicating a graphical user interface element in a 3D scene, comprising the steps of:
S10) providing a 3D model and a GUI element displayed in the 3D scene, the GUI element comprising an anchor attached to the 3D model and comprising a body, said body being a window containing text and/or graphical elements corresponding to the 3D model;
S20) receiving a first user interaction indicative of a hold gesture on the anchor, by a user using a first appendage;
S30) while maintaining the hold gesture of the first appendage on the anchor, receiving a second user interaction indicative a hold gesture on the body, by the user using a second appendage;
S40) while maintaining the hold gesture using the first appendage and the hold gesture using the second appendage, moving the second appendage outside the body, thereby duplicating the GUI element into a second GUI element, the second GUI element comprising an anchor, the position of the anchor of the second GUI element being defined by the position of second appendage.

The disclosure also relates to a computer program product comprising computer-executable instructions to cause a computer system to carry out the predefined method.

The disclosure also relates to a non-transitory computer-readable data-storage medium containing computer-executable instructions to cause a computer system to carry out the predefined method.

The disclosure also relates to a computer system comprising a processor coupled to a memory, the memory storing computer-executable instructions to cause the computer system to carry out the predefined method.

BRIEF DESCRIPTION OF THE DRAWINGS

Additional features and advantages of the present invention will become apparent from the subsequent description, taken in conjunction with the accompanying drawings.

DETAILED DESCRIPTION

Figure 1:
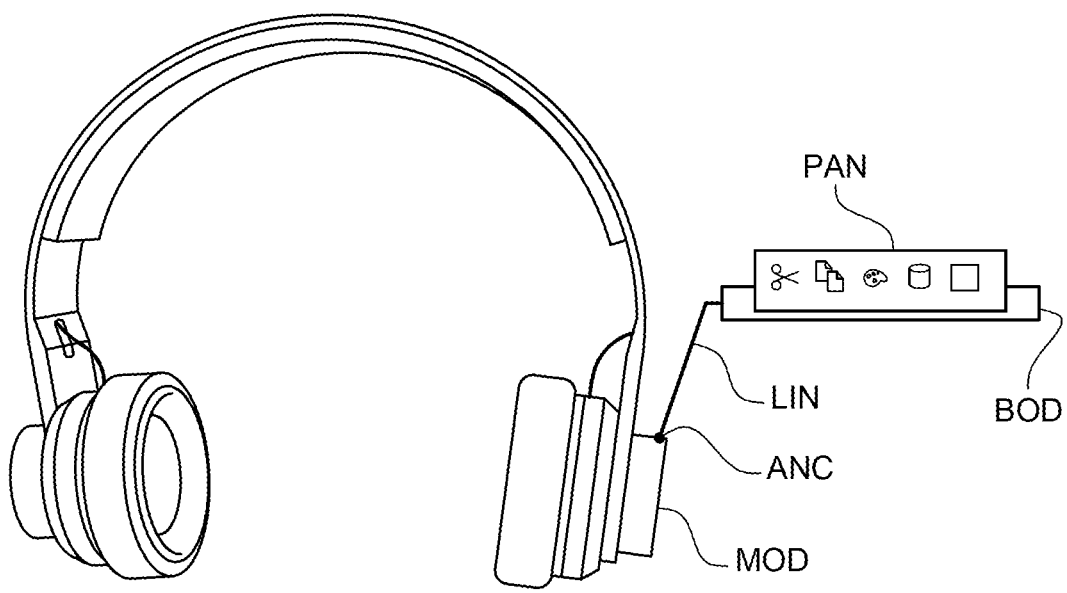
FIG. 1 illustrates a duplication method of a markup according to the prior art.
Figure 2:
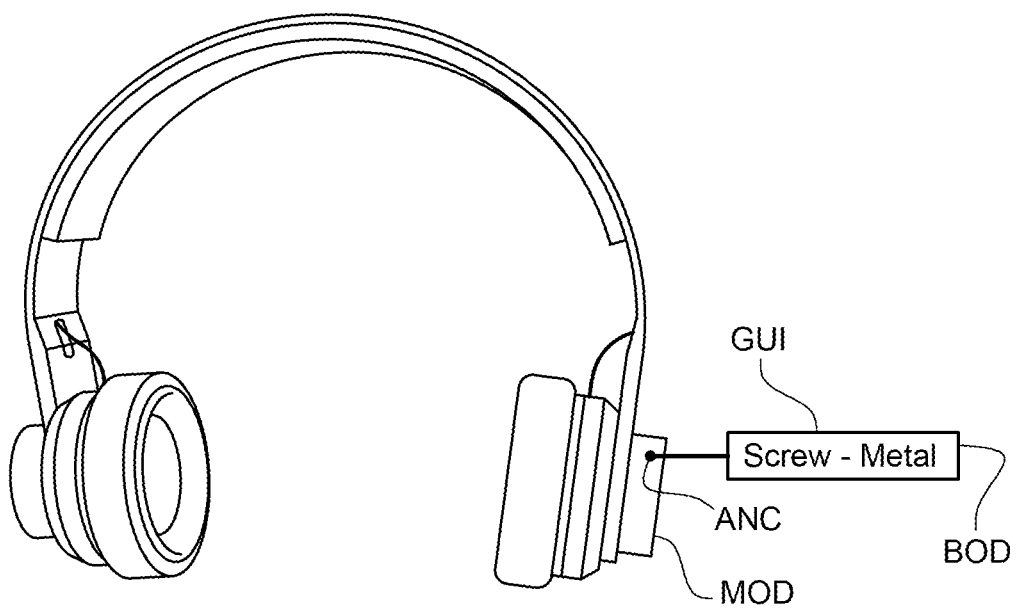
FIG. 2 illustrates the composition of a markup.

In a first step S10 of the invented method, a 3D model MOD and a GUI element GUI, such as a markup, are displayed in the 3D scene, as illustrated in FIG. 2.

The markup points toward a screw. The 3D scene comprises other 3D models, such as the headband, the protection, the cushion, the chamber and the holder. All these 3D models are bound to each other so as to form an assembly of 3D models. In FIG. 2, the assembly of 3D models is an audio headset.

The anchor ANC is attached to the screw. The body BOD of the markup is a window which indicates the label of the pointed 3D modem ("screw"), the material of the 3D model ("metal"). Graphical elements such as the color of the background, the color of the text and the font of the text also characterize the body BOD.

At that point, no user input is received on the touch panel.

The first embodiment of the invented method recites a single duplication of the markup, as illustrated by FIGS. 3A to 3E.

Figure 3A:
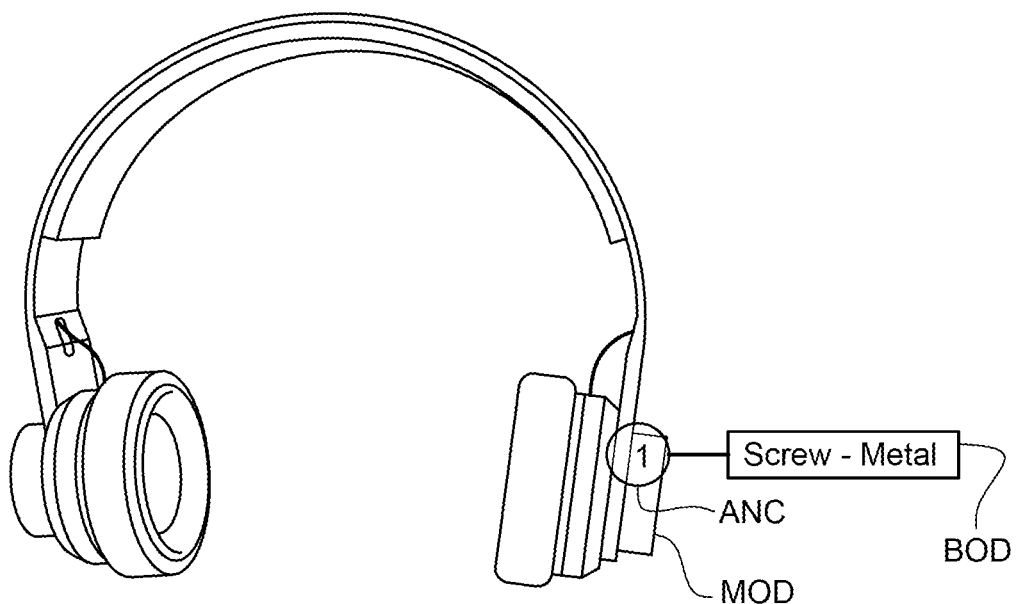
FIGS. 3A, 3B, 3C, 3D, and 3E illustrate a method for duplicating a markup according to a first embodiment of the invention.

In FIG. 3A, a first user interaction indicative of a hold gesture is received on the anchor ANC (step S20). A hold gesture may be defined as a maintained contact without release, during a time interval which is equal to or more than a predefined amount of time, between an appendage and the touchscreen.

The appendage may be a finger of the user, or even a stylus, even though it is more appropriate to use the fingers, as illustrated below for other embodiments.

On FIG. 3A, the first user interaction is represented by the encircled "1".

Figure 3B:
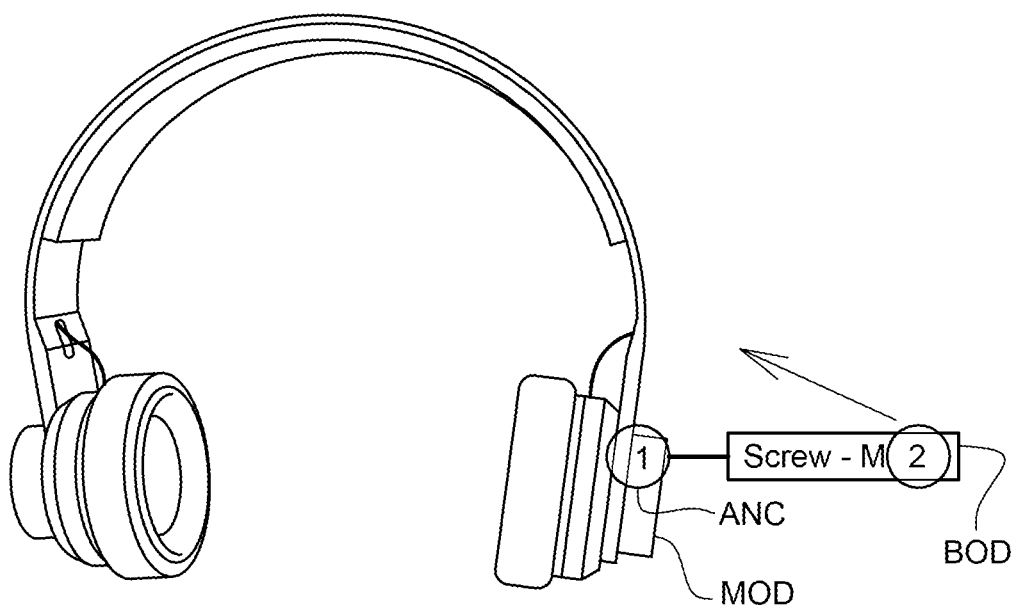

In a third step S30, while the user maintains the hold gesture of the first appendage on the anchor ANC, a second user interaction indicative a hold gesture is received on the body BOD. The second user interaction, which is represented by the encircled "2" on FIG. 3B, is implemented by using a second appendage 2.

The second appendage may be another finger of the same hand of the user, or a finger of the other hand, or another stylus.

Figure 3C:
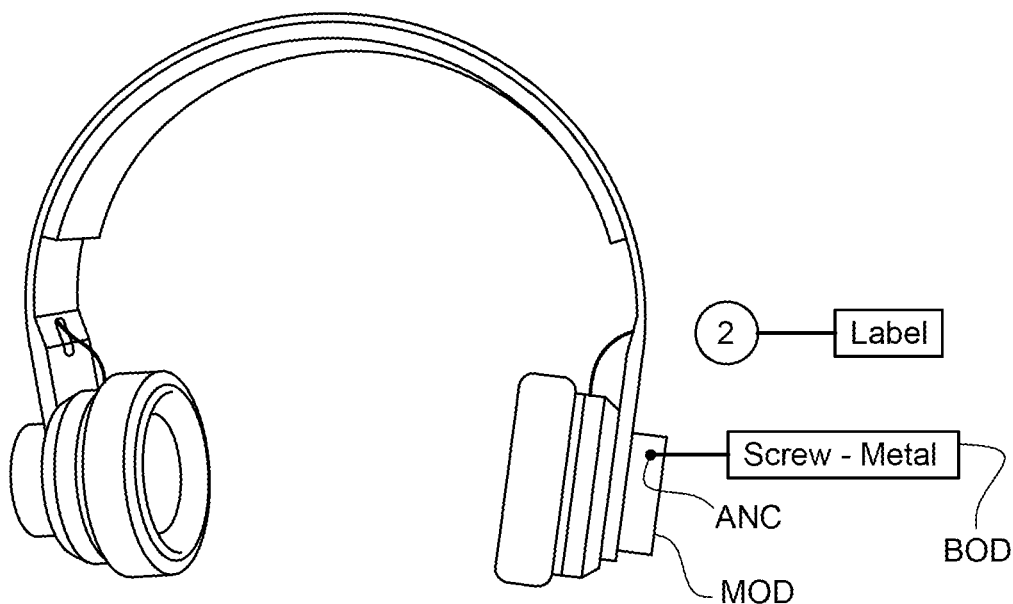

In a fourth step S40, the user moves the second appendage 2 outside the body BOD, while maintaining contact of the first and second appendages with the touch screen, as illustrated by FIG. 3C.

The movement of the second appendage 2 outside the body BOD activates a copy mode, as illustrated by FIG. 3C. In the copy mode, the markup GUI is duplicated into a second markup GUI2. Optionally, the user may then release the first appendage 1, so as to use it later on. If the contact of the first appendage is released before the second appendage is dragged, the duplication process is stopped (step S41, FIG. 7).

When the copy mode is activated, the user may move the second markup GUI2 in the 3D scene, while maintaining contact with the touch screen. The user navigates in the 3D scene so as to place the duplicated markup at the chosen location.

Figure 3D:
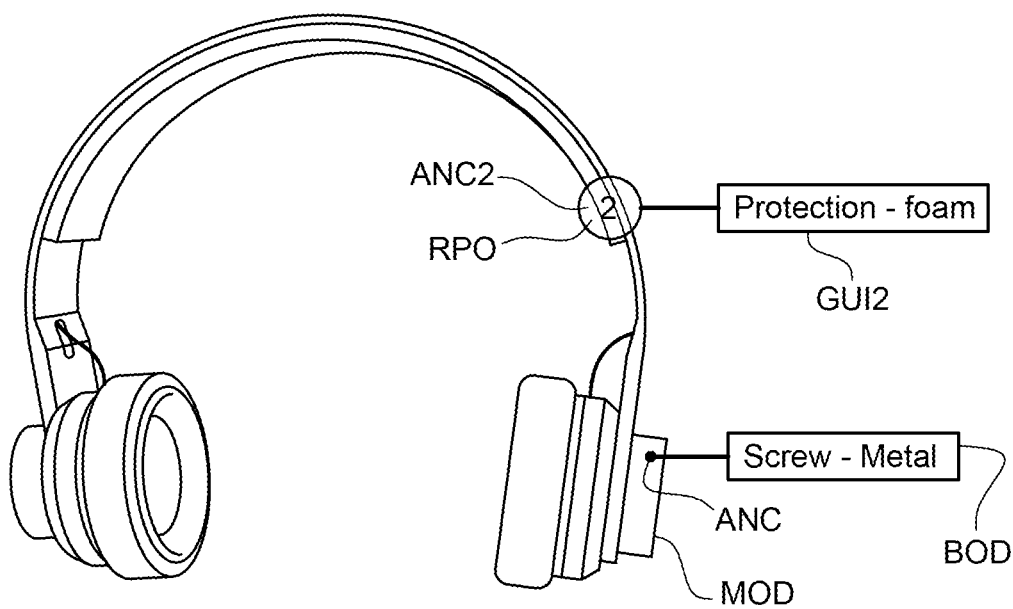
Figure 3E:
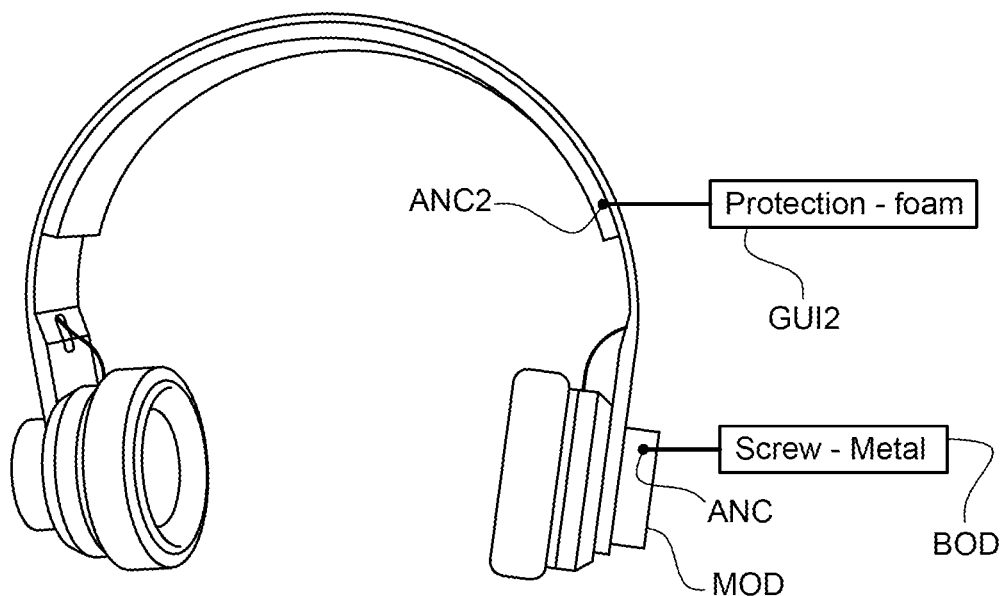
Figure 7:
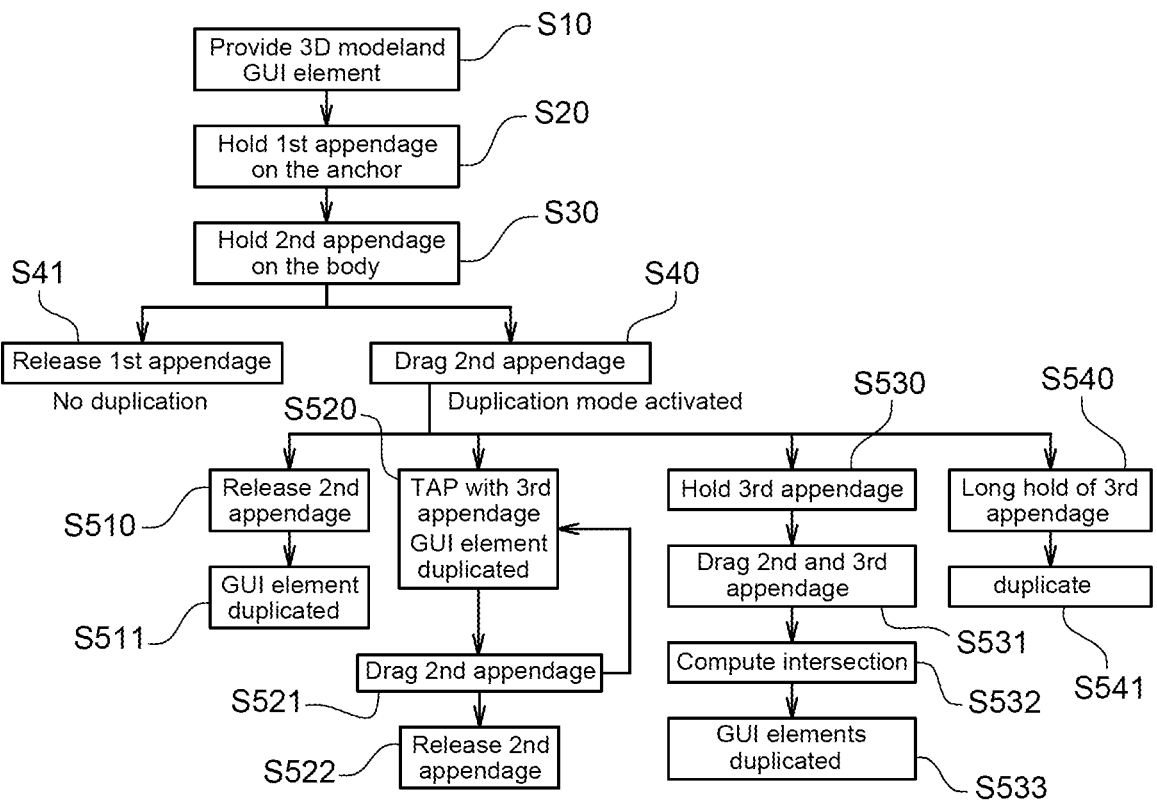
FIG. 7 illustrates a flow chart of the invented method.

It can be seen, on FIG. 3D, that the user releases the second appendage 2 at a release point RPO (third user interaction) which coincides with another 3D model, i.e. the foam of the headset (step S510, FIG. 7).

Thus, if it is detected that the release point coincides with another 3D model of the 3D scene, the second markup GUI2 is displayed and displays text and/or graphical elements corresponding to the other 3D model (step S511, FIG. 7).

The second markup GUI2 has the same structure than the first markup: the second markup GUI2 comprises an anchor ANC2 which is attached to the second 3D model, and a body which is a window containing text and/or graphical elements corresponding to the second 3D model.

Thus, the position of the anchor ANC2 of the second markup GUI2 is defined by the position of the release point RPO which corresponds to the last position of contact of the second appendage 2 on the touch screen.

As illustrated by FIG. 3D, the text of the markup is updated based on the second 3D model. The same fields are displayed, i.e. the name/label of the second 3D model ("protection"), and the material of the second 3D model ("foam"). The style elements (background color, color of the text, size of the text, etc.) of the second markup are the same as the style elements of the first markup. The text of the body may also include the color of the 3D model, the position of the 3D model in the 3D scene, the dimensions of the 3D model.

Thus, the invented method is very easy to use and intuitive.

Advantageously, the body and the anchor are displayed spaced apart each other, for each markup, so that the user may easily touch the anchor with one appendage, and the body with another appendage.

FIGS. 4A to 4H illustrate another embodiment of the invention. Steps S10, S20 and S30 of that embodiment are identical to the aforementioned embodiment: a 3D model and a markup which is anchored to the 3D model are provided (step S10, FIG. 4A); a first user interaction is received on the anchor (step S20, FIG. 4A); a second user interaction is received on the body (step S30, FIGS. 4B and 4C); the markup is duplicated into a second markup (step S40, FIG. 4D).

Then, a fourth user interaction which is indicative of a tap gesture by the user using a third appendage 3 is received (step S520, FIG. 7). A tap gesture may be defined as a quick contact (a press during a time interval which is lower than a predefined amount of time) between the appendage and the touchscreen, followed by a release of the appendage.

The third appendage can be any appendage excluding the second appendage: the user can use again a third finger, or the first finger to confirm the copy, if the contact of the latter has been removed from the touch screen.

Figure 4A:
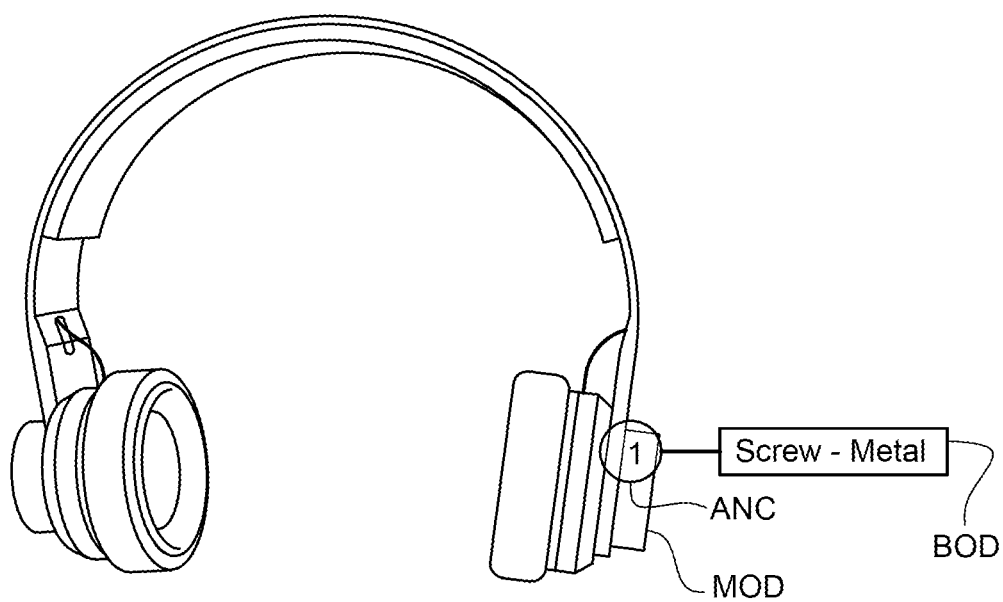
FIGS. 4A, 4B, 4C, 4D, 4E, 4F and 4H illustrate a method for duplicating a markup according to a second embodiment of the invention.
Figure 4B:
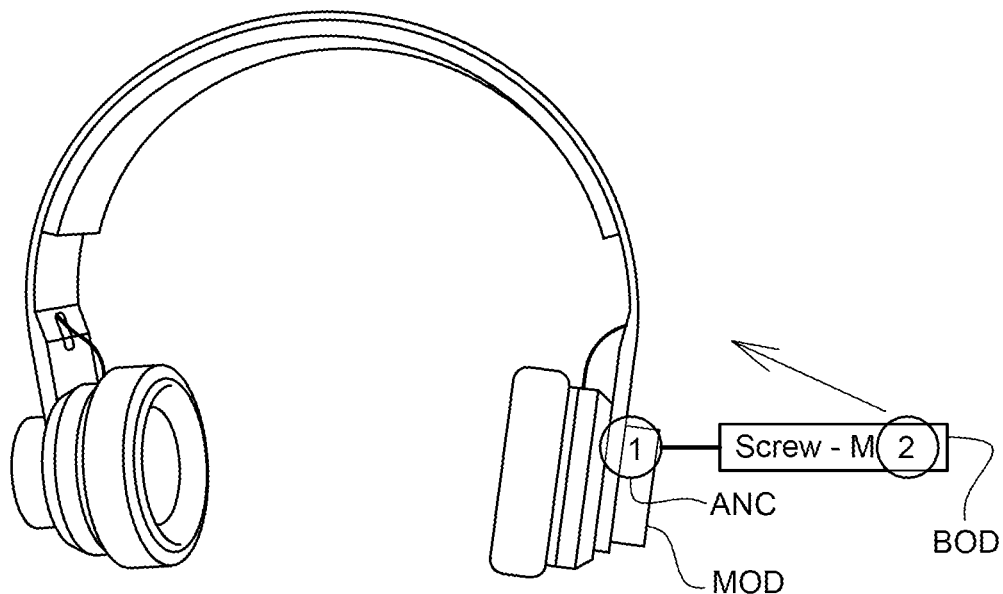
Figure 4C:
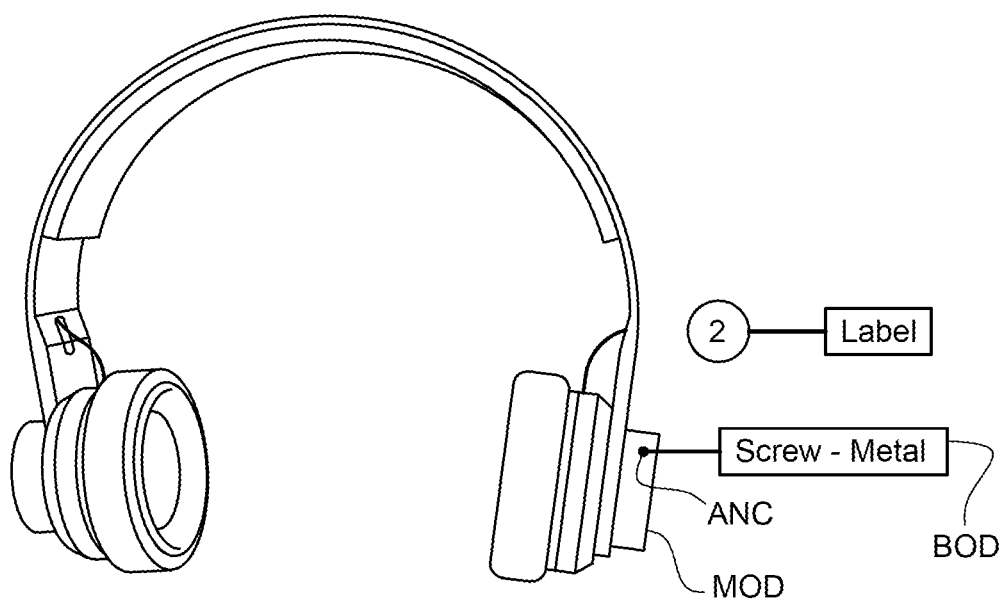
Figure 4D:
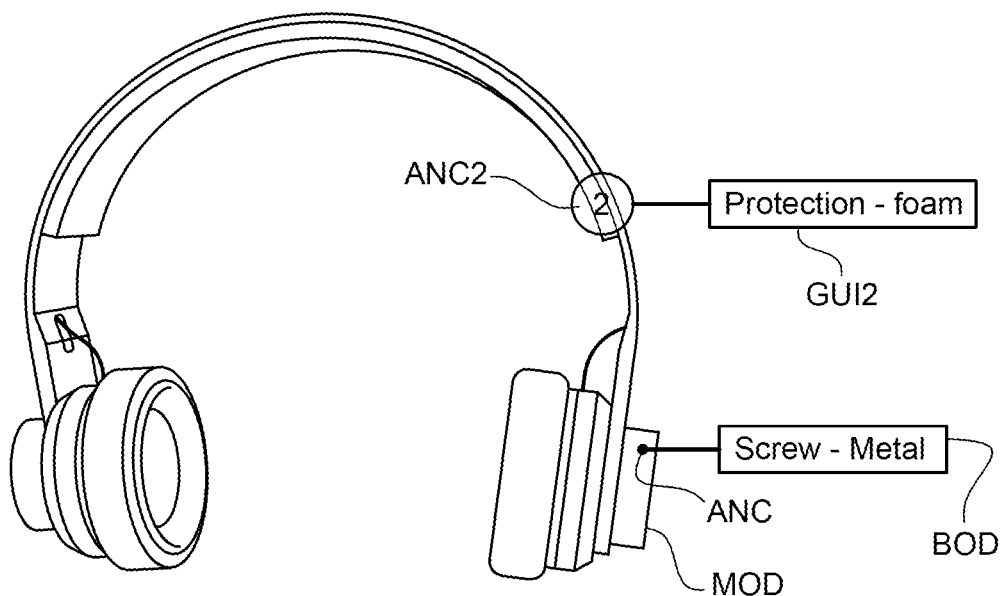
Figure 4E:
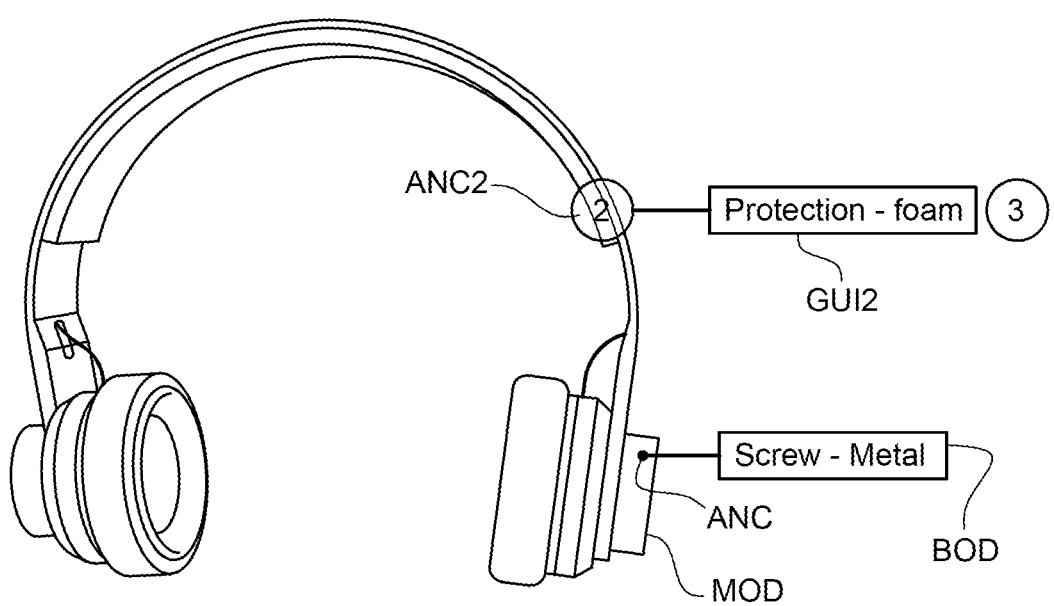

While the user maintains the hold gesture of the second appendage 2 on the anchor ANC2, the reception of a tap gesture on the touch screen, no matter where the tap gesture is received, validates the duplication of the markup, as illustrated by FIG. 4E. The second markup GUI2 is anchored to the second 3D model (headset protection); the content is adapted to the features of the second 3D model (name, material), while the style of the body is identical to the first markup's style.

Thus, the duplication terminates when the tap gesture is received, whereas, in the first embodiment, the duplication terminates when the release gesture is received.

Figure 4F:
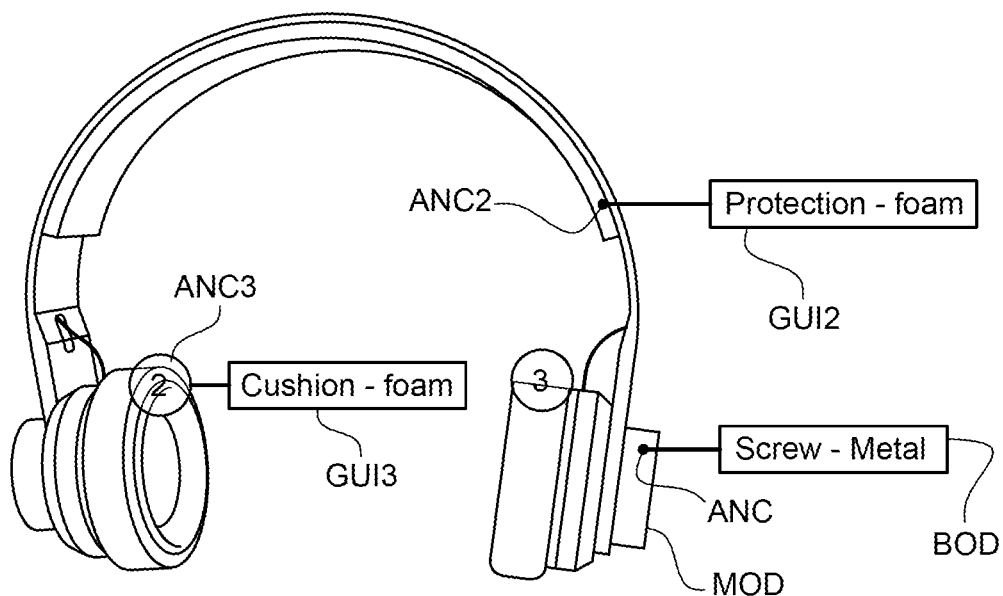

The user can still navigate in the 3D scene by maintaining the hold gesture of the second appendage 2, in order to duplicate the markup another time (step S521, FIG. 7). In FIG. 4F, another tap gesture by the third appendage 3 is received when the second appendage 2 is positioned on the cushion of the headset. Therefore, a third markup GUI3 is created; it is anchored to the contact point upon reception of the tap gesture. It comprises an anchor ANC3 and a body, which is a duplication of the first markup, except that the information of the body are adapted to the third 3D model.

Figure 4G:
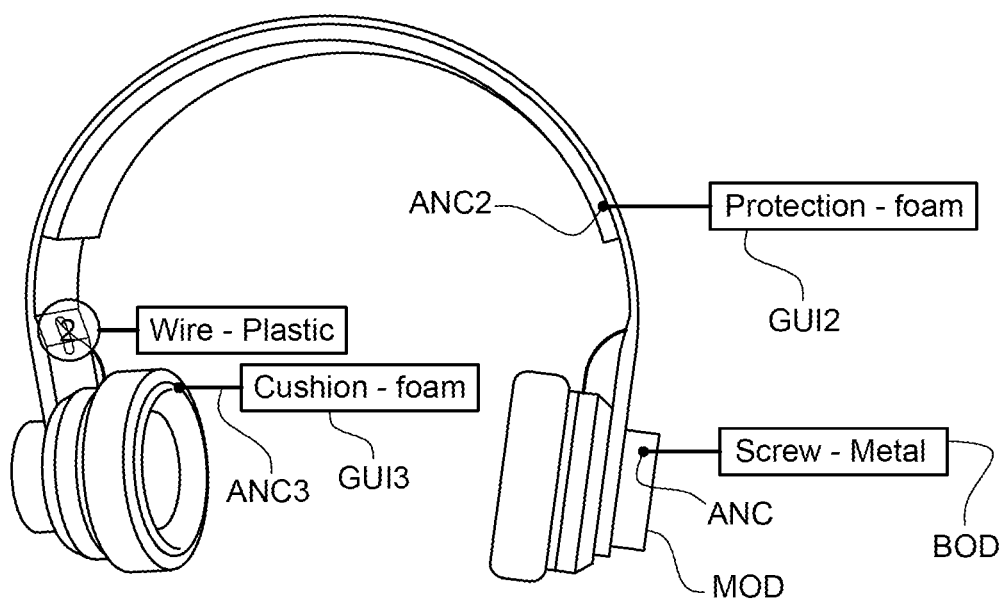
Figure 4H:
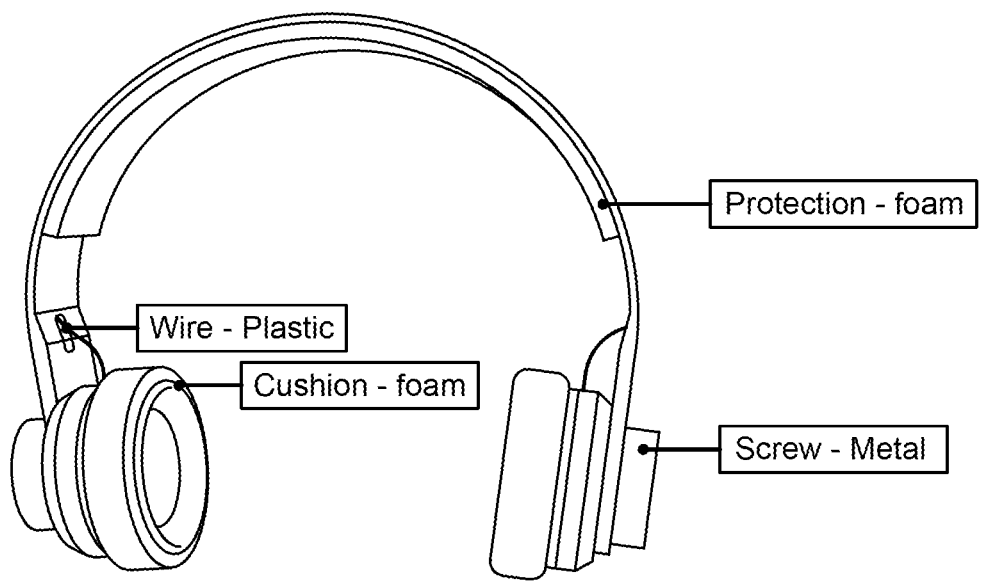

The user may duplicate the markup as many times as he wishes (as illustrated by FIGS. 4G and 4H), until the contact of the second appendage with the touch screen stops (step S522, FIG. 7)

Consequently, the user can quickly make multiple copies.

FIGS. 5A to 5F illustrate another embodiment of the invented method. Steps S10, S20 and S30 of that embodiment are identical to the aforementioned embodiment: a 3D model and a markup which is anchored to the 3D model are provided (step S10, FIG. 5A); a first user interaction is received on the anchor (step S20, FIG. 5A); a second user interaction is received on the body (step S30, FIGS. 5B and 5C); the markup is duplicated into a second markup (step S40, FIG. 5C).

Figure 5A:
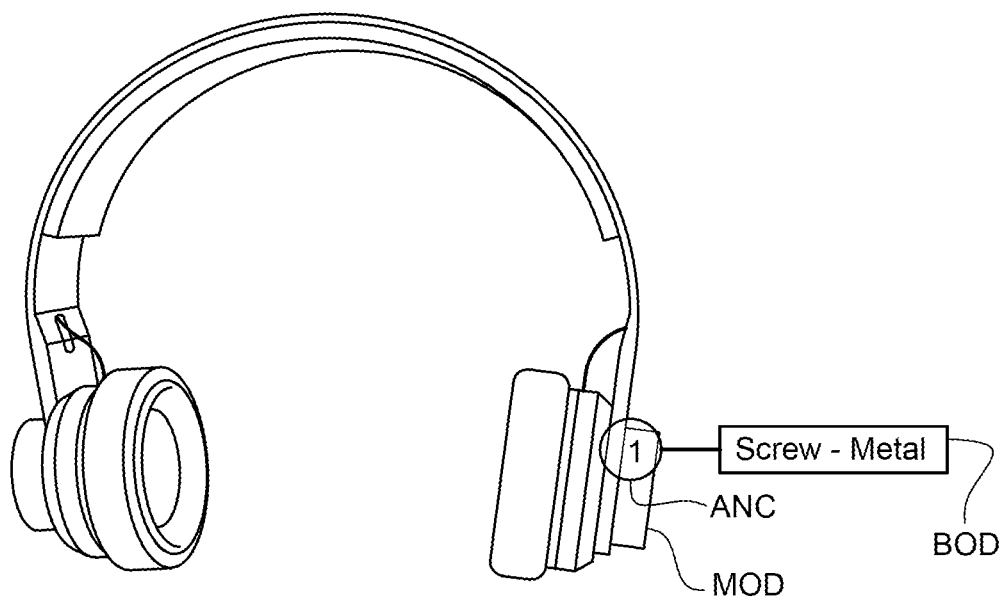
FIGS. 5A, 5B, 5C, 5D, 5E and 5F illustrate a method for duplicating a markup according to a third embodiment of the invention.
Figure 5B:
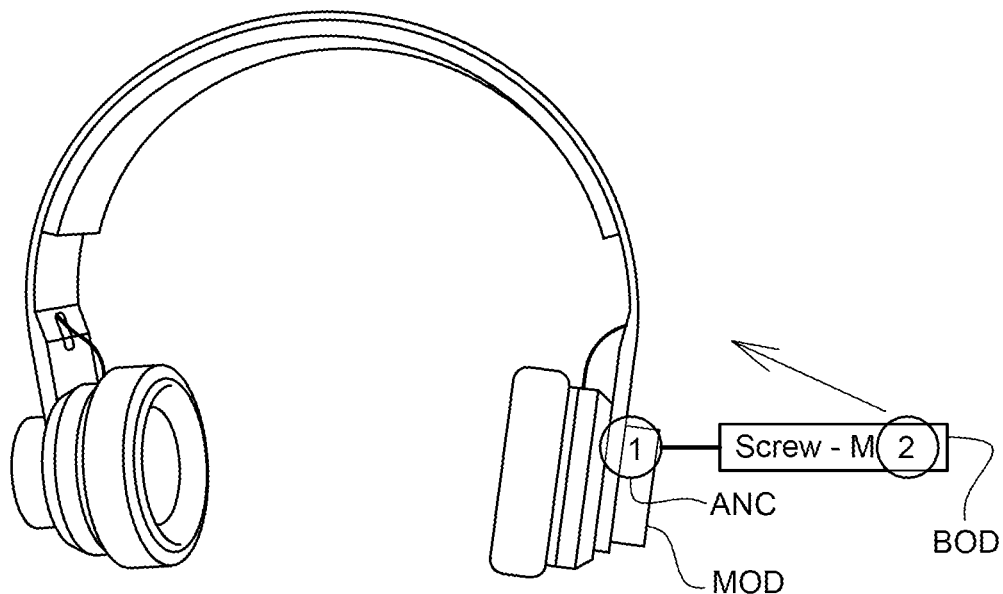
Figure 5C:
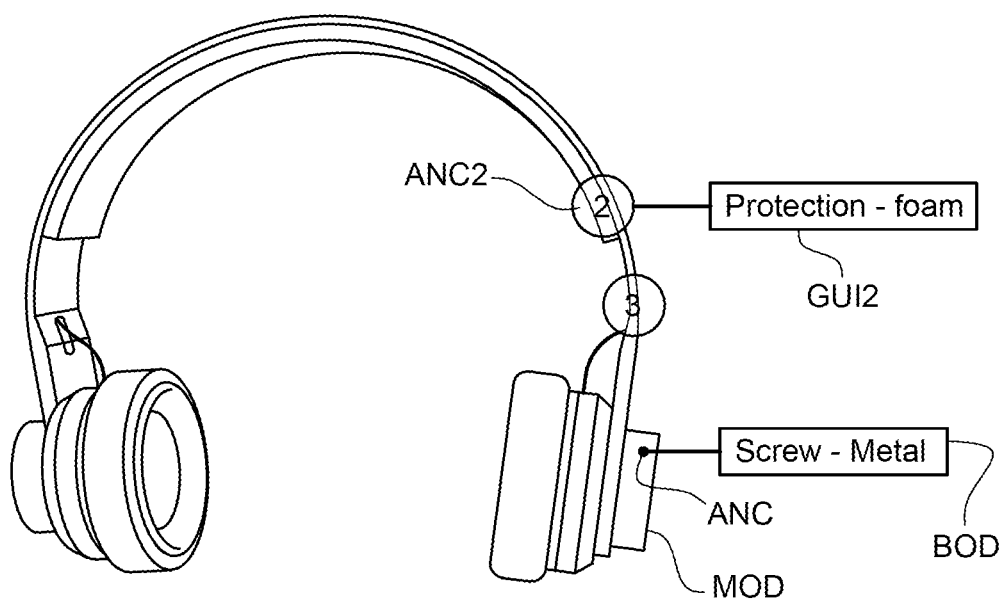

Then a hold gesture is received by using a third appendage (fifth user interaction, step S530, FIG. 7), while the hold gesture of the second appendage 2 is maintained, as illustrated by FIG. 5C. Here too, the third appendage can be any appendage excluding the second appendage.

Figure 5D:
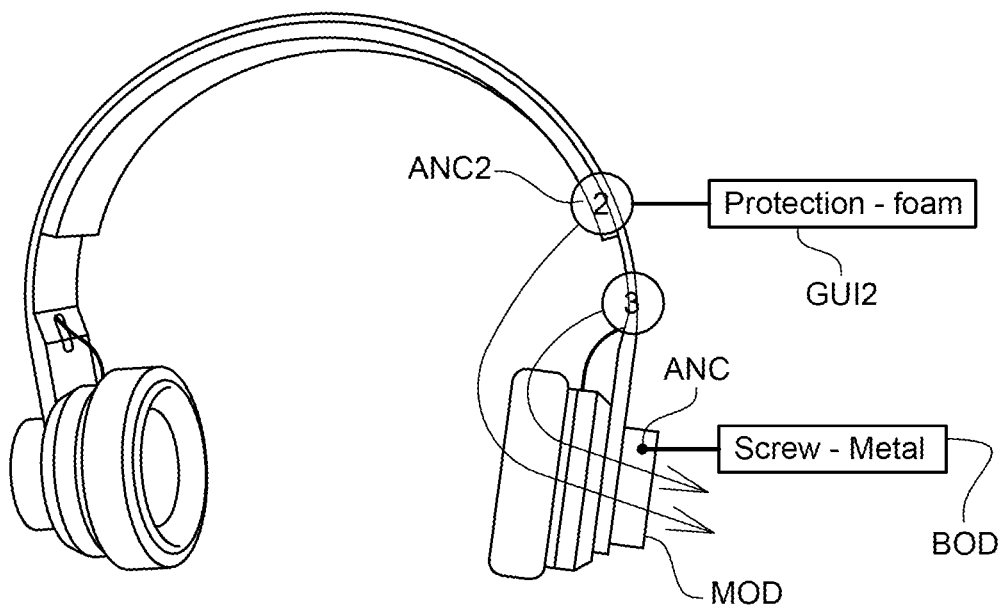

The user simultaneously drags the second and third appendages (FIG. 5D). A drag movement refers to a displacement of the second and third appendages while maintaining contact on the touch screen (sixth user interaction, step S531, FIG. 7).

During the drag of the second and third appendages, the intersection points of the position of the second or third appendages with at least one other 3D model is computed and stored (step S532, FIG. 7).

Then, the markup is duplicated for each intersected 3D model (step S533, FIG. 7): the style elements of each markup are identical as the style elements of the first markup GUI, and the text and/or graphical elements of each markup correspond to the features of the intersected 3D model. The duplication stops when the user releases the second or the third appendage.

Figure 5F:
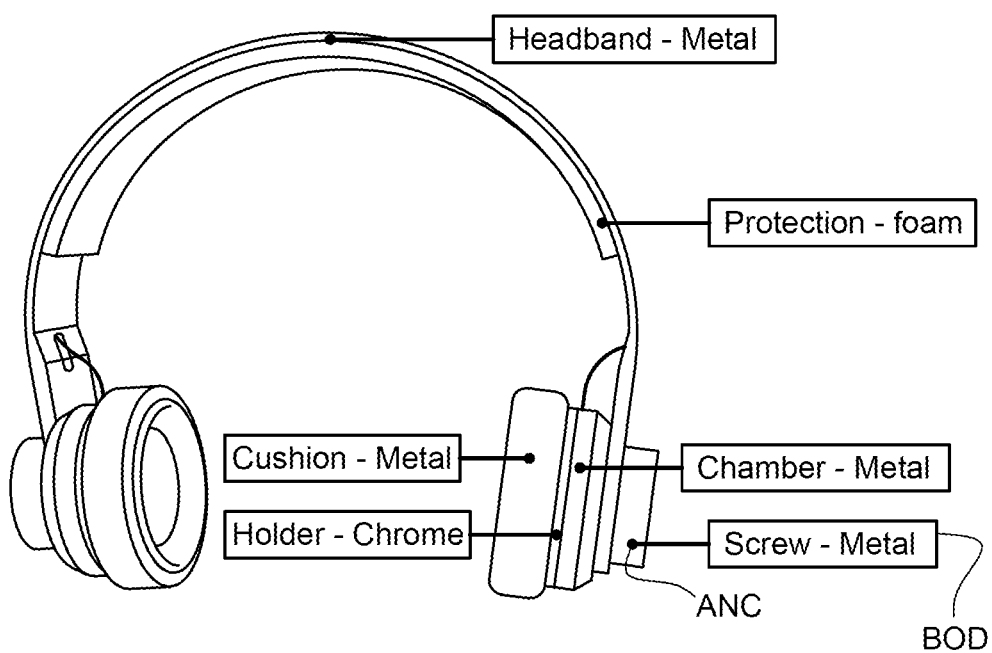
Figure 5E:
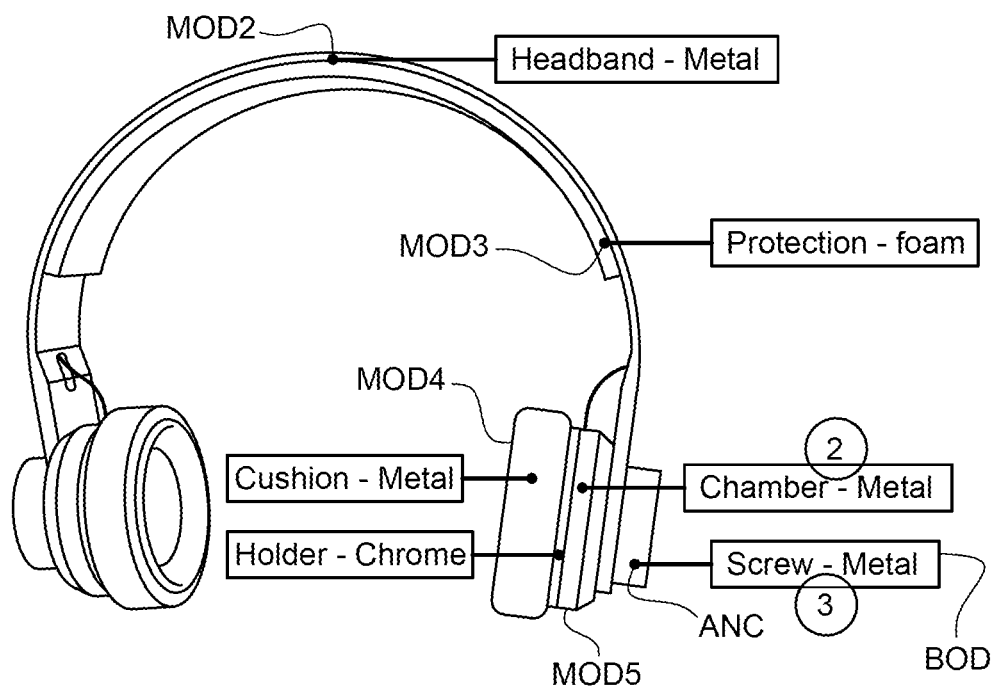

For example, on FIGS. 5E and 5F, the initial markup anchored to the screw is duplicated into:
a markup which is anchored to the headband MOD2;
a markup which is anchored to the protection MOD3;
a markup which is anchored to the cushion MOD4;
a markup which is anchored to the holder MOD5.

In a preferred embodiment, the feature tree FTR of the assembly of 3D models is displayed (or the feature tree of all the parts/sub-models constituting a 3D model), and the 3D model corresponding to the duplicated markup may be highlighted in real time.

The material of each 3D model is displayed in the corresponding body, and the label as well.

In a preferred embodiment, the anchor ANC of each of the duplicated markups is positioned at the center of a bounding box enclosing the intersected 3D model. Alternatively, the anchor may be positioned at the first intersection point of the second or third appendage with the 3D model.

Thus, the user can make multiple copies on the fly, by hovering on the 3D models or sub-models.

Figure 6A:
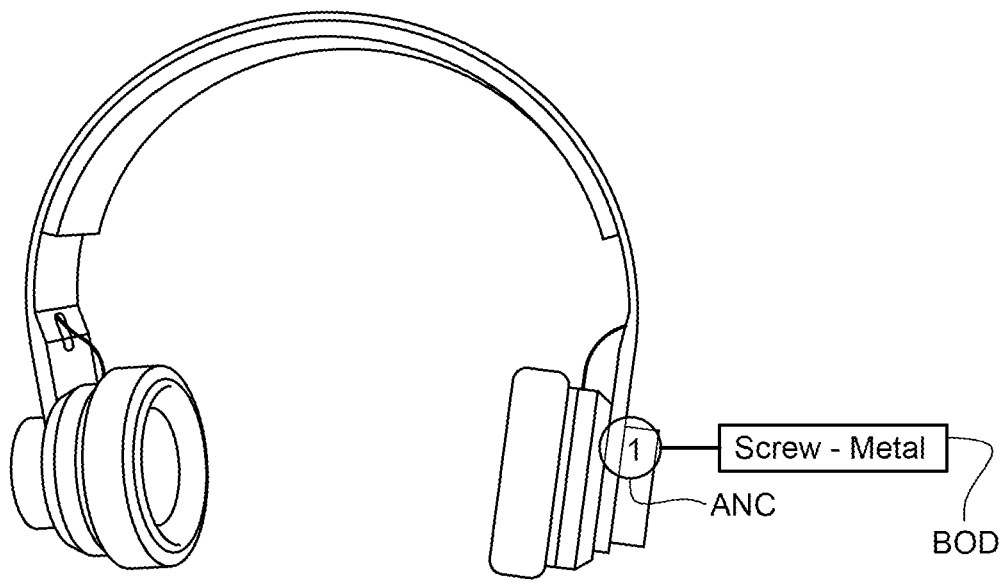
FIGS. 6A, 6B, 6C and 6D illustrate a method for duplicating a markup according to a fourth embodiment of the invention.
Figure 6B:
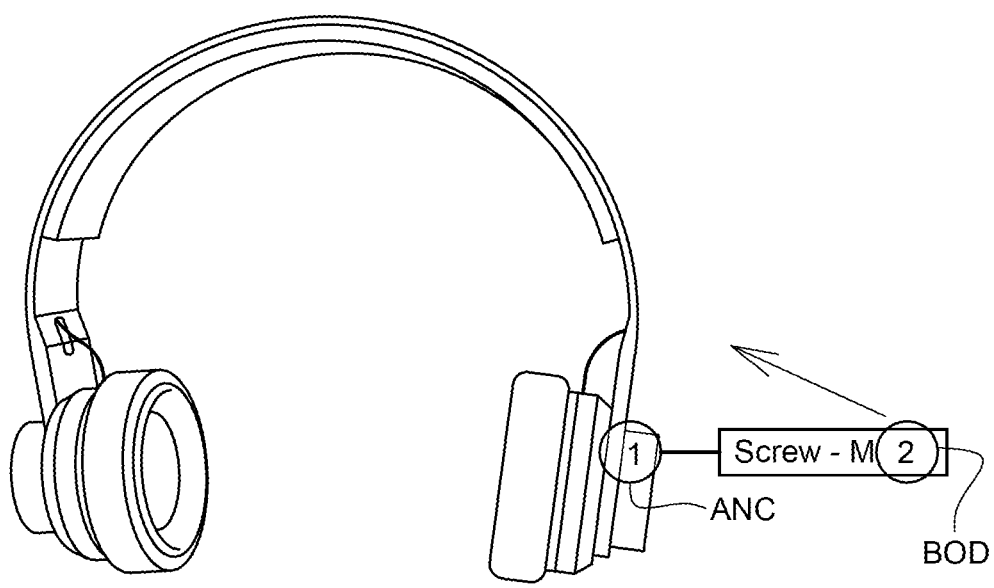

FIGS. 6A to 6D illustrate again another embodiment of the invented method. FIG. 6A illustrates the first user interaction which is received on the anchor ANC, as previously disclosed. FIG. 6B illustrates the aforementioned second user interaction which is received on the body BOD.

Figure 6C:
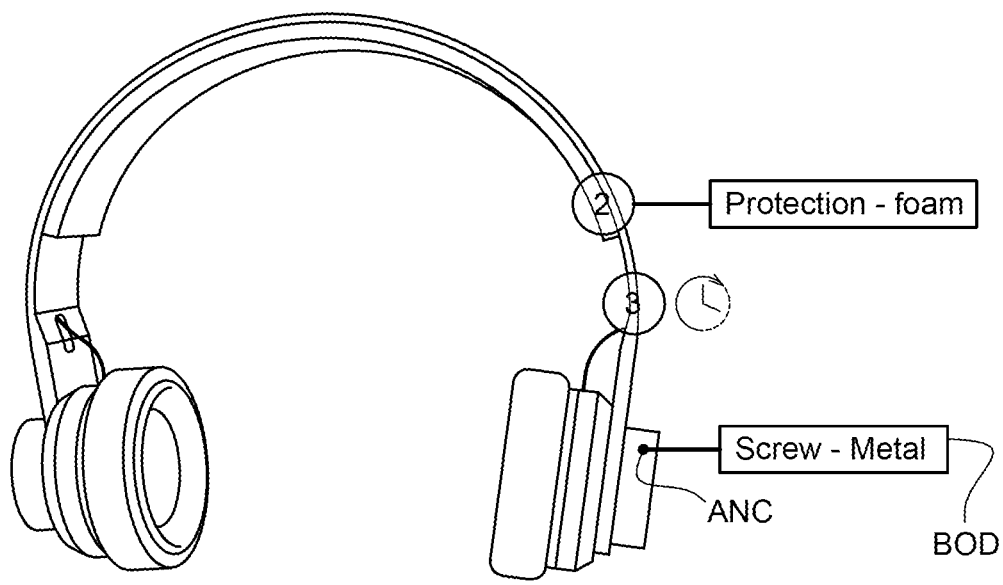

Then, while the hold gesture of the second appendage 2 is maintained, a hold gesture of the third appendage 3 is received for more than a predefined amount of time (seventh user interaction, step S540 FIG. 7), as illustrated by FIG. 6C.

The hold gesture of the third appendage 3 may be done anywhere on the touchscreen.

Figure 6D:
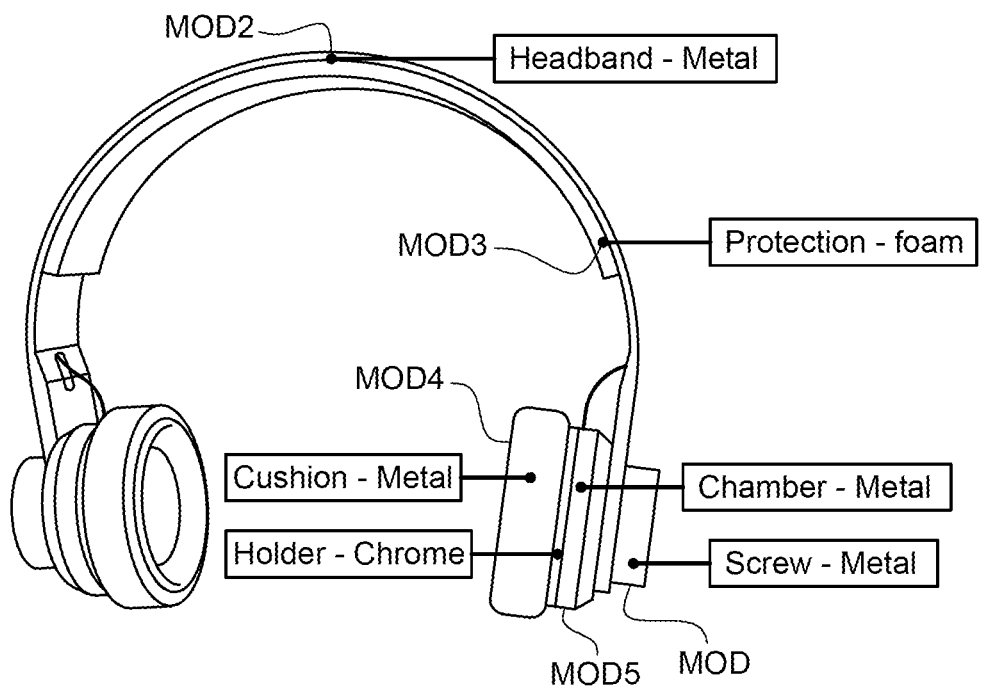

Once the predefined amount of time has been exceeded, the markup is duplicated for all the 3D models of the 3D scene (FIG. 6D). New copies of the markup are attached via the anchor to any model in the 3D scene. The text and/or graphical elements of each duplicated markup is adapted to the corresponding 3D model, and the style elements of each markup is identical to the style element of the source markup (step S541, FIG. 7).

Then, the user can release the contact of the second and third appendages with the touchscreen.

FIG. 7 illustrates a flow chart of the invented method, including all the aforementioned embodiments. It can be noticed that the user can easily select one of the duplication modes once the second appendage has been dragged, depending on his needs, and without any further input.

Thus, the user can duplicate and place the newly created markups almost at the same time.

The invention has been disclosed for duplicating a markup, but it could be extended to any kind of GUI element comprising an anchor attached to the 3D model and comprising a body, said body being a window containing text and/or graphical elements corresponding to the 3D model.

The inventive method can be performed by a suitably-programmed general-purpose computer or computer system, possibly including a computer network, storing a suitable program in non-volatile form on a computer-readable medium such as a hard disk, a solid state disk or a CD-ROM and executing said program using its microprocessor(s) and memory.

Figure 8:
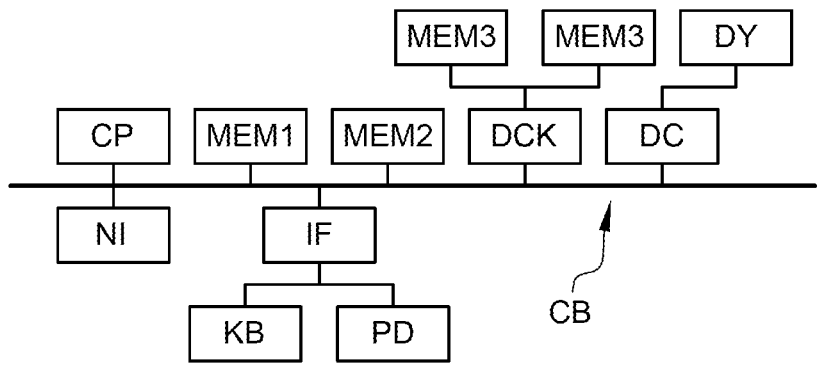
FIG. 8 illustrates a computer for carrying out the invented method.

A computer—more precisely a computer aided design station—suitable for carrying out a method according to an exemplary embodiment of the present invention is described with reference to FIG. 8. In FIG. 8, the computer includes a Central Processing Unit CP which performs the processes described above. The process can be stored as an executable program, i.e. a set of computer-readable instructions in memory, such as RAM MEM1 or ROM MEM2, or on hard disk drive (HDD) MEM3, DVD/CD drive MEM4, or can be stored remotely. 3D models database in a form suitable to be processed by the executable program according to the inventive method—may also be stored on one or more of memory devices MEM1 to MEM4, or remotely.

The claimed invention is not limited by the form of the computer-readable media on which the computer-readable instructions of the inventive process are stored. For example, the instructions and databases can be stored on CDs, DVDs, in FLASH memory, RAM, ROM, PROM, EPROM, EEPROM, hard disk or any other information processing device with which the computer aided design station communicates, such as a server or computer. The program and the database can be stored on a same memory device or on different memory devices.

Further, a computer program suitable for carrying out the inventive method can be provided as a utility application, background daemon, or component of an operating system, or combination thereof, executing in conjunction with CPU PR and an operating system such as Microsoft VISTA, Microsoft Windows 7, UNIX, Solaris, LINUX, Apple MAC-OS and other systems known to those skilled in the art.

The Central Processing Unit CP can be a Xenon processor from Intel of America or an Opteron processor from AMD of America, or can be other processor types, such as a Freescale ColdFire, IMX, or ARM processor from Freescale Corporation of America. Alternatively, the Central Processing Unit CP can be a processor such as a Core2 Duo from Intel Corporation of America, or can be implemented on an FPGA, ASIC, PLD or using discrete logic circuits, as one of ordinary skill in the art would recognize. Further, the CPU can be implemented as multiple processors cooperatively working to perform the computer-readable instructions of the inventive processes described above.

The computer aided design station in FIG. 7 also includes a network interface NI, such as an Intel Ethernet PRO network interface card from Intel Corporation of America, for interfacing with a network, such as a local area network (LAN), wide area network (WAN), the Internet and the like. The computer aided design station further includes a display controller DC, such as a NVIDIA GeForce GTX graphics adaptor from NVIDIA Corporation of America for interfacing with display DY, such as a Hewlett Packard HPL2445w LCD monitor or a virtual reality headset. A general purpose I/O interface IF interfaces with a keyboard KB and pointing device PD, such as a roller ball, mouse, touchpad, control devices of a virtual reality system and the like. The display, the keyboard and the pointing device, together with the display controller and the I/O interlaces, form a graphical user interface.

The invention has been disclosed for an implementation in touch mode, wherein a computer system comprises a touch sensitive display for displaying the 3D scene and detecting interactions of one the appendages.

The invention could also be implemented in an immersive environment. In that case, the computer system comprises a virtual reality headset, which is worn by the user, for displaying the 3D scene. The different user interactions may be detected by means of control devices, which may be equipped with buttons so as to detect a tap gesture, a drag or a hold gesture. The computer system may also comprise sensing devices, such as infrared sensors, in order to determine the location of the control devices.

Disk controller DKC connects HDD MEM3 and DVD/CD MEM4 with communication bus CB, which can be an ISA, EISA, VESA, PCI, or similar, for interconnecting all of the components of the computer aided design station.

A description of the general features and functionality of the display, keyboard, pointing device, as well as the display controller, disk controller, network interface and I/O interface is omitted herein for brevity as these features are known.

Figure 9:
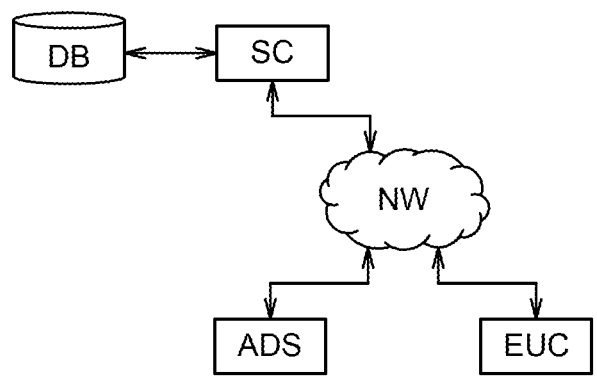
FIG. 9 is a block diagram of a computer system suitable for carrying out a method.

FIG. 9 is a block diagram of a computer system suitable for carrying out a method according to a different exemplary embodiment of the present invention.

In FIG. 9, the server SC is connected to an administrator system ADS and end user computer EUC via a network NW.

As can be appreciated, the network NW can be a public network, such as the Internet, or a private network such as an LAN or WAN network, or any combination thereof and can also include PSTN or ISDN sub-networks. The network NW can also be wired, such as an Ethernet network, or can be wireless such as a cellular network including EDGE, 3G and 4G wireless cellular systems. The wireless network can also be Wi-Fi, Bluetooth, or any other wireless form of communication that is known. Thus, the network NW is merely exemplary and in no way limits the scope of the present advancements.

The client program stored in a memory device of the end user computer and executed by a CPU of the latter accesses the 3D model databases on the server via the network NW. This allows an end user to select a 3D model, and to pre-position them in the 3D scene. The server performs the processing as described above with reference to FIGS. 2 to 7, taking into account inputs from the user. It then transmits the annotated 3D models to the end user computer, again using the network NW.

Although only one administrator system ADS and one end user system EUX are shown, the system can support any number of administrator systems and/or end user systems without limitation.

Any processes, descriptions or blocks in flowcharts described herein should be understood as representing modules, segments, or portions of code which include one or more executable instructions for implementing specific logical functions or steps in the process, and alternate implementations are included within the scope of the exemplary embodiment of the present invention.

The invention claimed is:

1. A computer-implemented method for duplicating a graphical user interface element in a 3D scene, comprising:
    obtaining a 3D model and a GUI element displayed in the 3D scene, and at least one second 3D model displayed in the 3D scene, the GUI element comprising an anchor attached to the 3D model (MOD) and comprising a body, said body being a window containing text and/or graphical elements corresponding to the 3D model;
    receiving a first user interaction indicative of a hold gesture on the anchor (ANC), by a user using a first appendage;
    while maintaining the hold gesture of the first appendage on the anchor, receiving a second user interaction indicative a hold gesture on the body, by the user using a second appendage; and
    while maintaining the hold gesture using the first appendage and the hold gesture using the second appendage, moving the second appendage outside the body, thereby duplicating the GUI element into a second GUI element, the second GUI element being attached to the second 3D model and comprising an anchor, a position of the anchor of the second GUI element being defined by a position of the second appendage,
    wherein the moving further comprises:
    determining at least one style element of the GUI element's body of the 3D model; and
    updating the text and/or graphical elements of the second GUI element and applying the style element of the GUI element to the second GUI element.

2. The computer-implemented method according to claim 1, further comprising, after the moving, receiving a third user interaction indicative of a release gesture of the second appendage at a release point, the position of the anchor of the second GUI element being defined by the position of the release point.

3. The method according to claim 2, wherein the body and the anchor are displayed spaced apart each other.

4. The computer-implemented method according to claim 1, further comprising, after the moving, receiving a fourth user interaction indicative of a tap gesture by the user using a third appendage while maintaining the hold gesture of the second appendage on the body, the position of the anchor of the second GUI element being defined by the position of the second appendage upon reception of the tap gesture.

5. The method according to claim 4, wherein the body and the anchor are displayed spaced apart each other.

6. The computer-implemented method according to claim 1, further comprising, after the moving:
   receiving a fifth user interaction indicative of a hold gesture by the user using a third appendage while maintaining the hold gesture of the second appendage;
   receiving a sixth user interaction indicative of a simultaneous drag gesture by the user using the second appendage and the third appendage;
   computing an intersection of one among the second appendage or the third appendage with at least one other 3D model; and
   duplicating the GUI element for each intersected other 3D model.

7. The computer-implemented method according to claim 6, wherein the anchor of the second GUI element is positioned at a first intersection point of the second appendage or the third appendage with the intersected other 3D model.

8. The computer-implemented method according to claim 1, wherein the 3D scene includes at least two 3D models, and the method further comprises, after the moving:
   receiving a seventh user interaction indicative of a hold gesture using third appendage, while maintaining the hold gesture of the second appendage, for more than a predefined amount of time; and
   duplicating the GUI element for all the 3D models.

9. The computer-implemented method according to claim 1, wherein the body and the anchor are displayed spaced apart each other.

10. The computer-implemented method according to claim 1, wherein:
   the text and/or graphical elements include at least one among a name of the 3D model, a material of the 3D model, a color of the 3D model, the position of the 3D model in the 3D scene, dimensions of the 3D model, and
   the style element includes one among font, style, size and color of the body.

11. The computer-implemented method according to claim 1, wherein the moving further comprises receiving a release gesture of the first appendage after the duplication of the GUI element.

12. A non-transitory computer-readable data-storage medium containing computer-executable instructions that when executed by a processor causes a computer system to carry out a method for duplicating a graphical user interface element in a 3D scene, comprising:
   obtaining a 3D model and a GUI element displayed in the 3D scene, and at least one second 3D model displayed in the 3D scene, the GUI element comprising an anchor attached to the 3D model (MOD) and comprising a body, said body being a window containing text and/or graphical elements corresponding to the 3D model;
   receiving a first user interaction indicative of a hold gesture on the anchor (ANC), by a user using a first appendage;
   while maintaining the hold gesture of the first appendage on the anchor, receiving a second user interaction indicative a hold gesture on the body, by the user using a second appendage; and
   while maintaining the hold gesture using the first appendage and the hold gesture using the second appendage, moving the second appendage outside the body, thereby duplicating the GUI element into a second GUI element, the second GUI element being attached to the second 3D model and comprising an anchor, a position of the anchor of the second GUI element being defined by a position of the second appendage,
   wherein the moving further comprises:
   determining at least one style element of the GUI element's body of the 3D model; and
   updating the text and/or graphical elements of the second GUI element and applying the style element of the GUI element to the second GUI element.

13. A computer system comprising:
   a processor coupled to a memory, the memory storing computer-executable instructions for duplicating a graphical user interface element in a 3D scene that when executed by the processor cause the processor to be configured to:
   obtain a 3D model and a GUI element displayed in the 3D scene, and at least one second 3D model displayed in the 3D scene, the GUI element comprising an anchor attached to the 3D model (MOD) and comprising a body, said body being a window containing text and/or graphical elements corresponding to the 3D model,
   receive a first user interaction indicative of a hold gesture on the anchor (ANC), by a user using a first appendage,
   while maintaining the hold gesture of the first appendage on the anchor, receive a second user interaction indicative a hold gesture on the body, by the user using a second appendage, and
   while maintaining the hold gesture using the first appendage and the hold gesture using the second appendage, move the second appendage outside the body, thereby duplicating the GUI element into a second GUI element, the second GUI element being attached to the second 3D model and comprising an anchor, a position of the anchor of the second GUI element being defined by a position of second appendage,
   wherein the processor is configured to move the second appendage by being further configured to:
   determine at least one style element of the GUI element's body of the 3D model; and
   update the text and/or graphical elements of the second GUI element and applying the style element of the GUI element to the second GUI element.

14. The computer system of claim 13, further comprising a touch sensitive display for displaying the 3D scene and detecting interactions of one of first and second the appendages.

15. The computer system of claim 13, further comprising a virtual reality headset for displaying the 3D scene in a virtual environment, and control devices or sensing devices for detecting interactions of one of the first and second appendages.

16. A computer-implemented method for duplicating a graphical user interface element in a 3D scene, comprising:
   obtaining a 3D model and a GUI element displayed in the 3D scene, and at least one second 3D model displayed in the 3D scene, the GUI element comprising an anchor attached to the 3D model (MOD) and comprising a body, said body being a window containing text and/or graphical elements corresponding to the 3D model;
   receiving a first user interaction indicative of a hold gesture on the anchor (ANC), by a user using a first appendage;
   while maintaining the hold gesture of the first appendage on the anchor, receiving a second user interaction indicative a hold gesture on the body, by the user using a second appendage; and while maintaining the hold gesture using the first appendage and the hold gesture using the second appendage, moving the second appendage outside the body, thereby duplicating the GUI element into a second GUI element, the second GUI element being attached to the second 3D model and comprising an anchor, a position of the anchor of the second GUI element being defined by a position of the second appendage; and after the moving, receiving a third user interaction indicative of a tap gesture by the user using a third appendage while maintaining the hold gesture of the second appendage on the body, the position of the anchor of the second GUI element being defined by the position of the second appendage upon reception of the tap gesture.

* * * * *